United States Patent [19]

Thomas

[11] Patent Number: 4,870,384

[45] Date of Patent: Sep. 26, 1989

[54] FREQUENCY OR PHASE MODULATION

[75] Inventor: Neil E. Thomas, St. Albans, United Kingdom

[73] Assignee: Marconi Instruments Limited, Hertfordshire, United Kingdom

[21] Appl. No.: 287,091

[22] Filed: Dec. 21, 1988

[30] Foreign Application Priority Data

Dec. 23, 1987 [GB] United Kingdom ............... 8729996

[51] Int. Cl.$^4$ .......................... H03C 3/00; H03C 3/08
[52] U.S. Cl. ..................................... 332/123; 332/144
[58] Field of Search ............... 332/16 R, 18, 19, 23 R; 331/1 A, 16, 25; 375/38, 44, 58, 59, 60, 62, 65, 67, 120; 455/42, 75, 76, 110, 113, 119

[56] References Cited

U.S. PATENT DOCUMENTS 4,543,542 9/1985 Owen ............................ 332/19 X
4,562,414 12/1985 Linder et al. ................. 332/19 X
4,810,977 3/1989 Flugstad et al. .................. 332/19

Primary Examiner—David Mis
Attorney, Agent, or Firm—Spencer & Frank

[57] ABSTRACT

A frequency or phase modulator, in particular a DC-coupled frequency modulation synthesizer, comprises a voltage-controlled oscillator (1) in series with a divider (2) in a phase-locked loop, and an analog-to-digital converter (17) connected to control the divider in accordance with an input analog modulation signal. The converter (17), preferably a one-bit charge-balanced converter, has a noise-shaped frequency response to reduce noise at frequencies below the loop-bandwidth.

8 Claims, 3 Drawing Sheets

FREQUENCY OR PHASE MODULATION

FIELD OF THE INVENTION

This invention relates to frequency or phase modulation and particularly although not exclusively to direct current-coupled frequency modulation. The invention is particularly useful in the synthesis of signals whose bandwidths are broadened by means of frequency or phase modulation.

It is often desirable to frequency modulate a synthesised frequency source with signals which extend in frequency from DC to over 100 kHz.

DESCRIPTION OF THE PRIOR ART

Several schemes exist for generating such modulated, synthesized signals, but all have the disadvantage of high complexity, cost or relatively poor performance. The invention to be described can be applied to any synthesiser having a digital controlled input which allows the synthesizer to be switched between two or more frequencies. If the switching speed of the digital control input is below that required to give the required modulation bandwidth, an analogue input is required to provide the additional bandwidth using two point modulation.

BRIEF SUMMARY OF THE INVENTION

According to a first aspect of this invention, a frequency or phase modulator comprises a voltage controlled oscillator in series with a divider in a phase-locked loop, and an analogue-to-digital converter connected to control the divider in accordance with an input analogue modulation signal, the analogue-to-digital converter having a noise-shaped frequency response so as to reduce noise at frequencies below the loop bandwidth to substantially below the white noise level which would prevail without noise-shaping.

The use of a noise-shaped analogue-to-digital converter improves substantially the sensitivity of the modulator to the input analogue modulation signal.

Preferably, the modulator includes means for applying the input modulation signal to the voltage-controlled oscillator. This provides a second, direct modulation route for controlling the voltage-controlled oscillator (VCO) which provides for frequency or phase modulation above the bandwidth of the loop, i.e. at those frequencies at which the first modulation route, via the analogue-to-digital converter, is ineffective.

Conveniently, the components of the modulator have characteristics selected such that at the phase-locked loop bandwidth the gain of the modulation route via the analogue-to-digital converter is substantially equal to the gain of the modulation applied to the voltage controlled oscillator.

The best performance is obtained when the analogue-to-digital converter is a one-bit converter. Such a one-bit analogue-to-digital converter (ADC) may be noise-shaped by including at least one further integrator with lead network in the negative feedback loop of a charge-balanced ADC. This arrangement is disclosed in: "An Experimental 16-Bit, A/D Converter for Digital Audio Applications" by E. C. Dijkmans and P. J. A. Naus, I.E.E. Colloquium on Advanced A/D Conversion Techniques (Digest No. 48) London, England (15th Apr. 1987). A formal derivation of the error spectrum associated with noise-shaping can be found from: "Reduction of Quantizing Noise by use of Feedback" by H. A. Spang and P. M. Schultheiss, I.R.E. Trans. Commun. Sys., pp. 373-380, Dec. 1962.

Brief Description of the Drawings

In the drawings, corresponding elements are denoted by identical reference numerals.

Detailed Description of the Preferred Embodiments of the Invention

Figure 1:
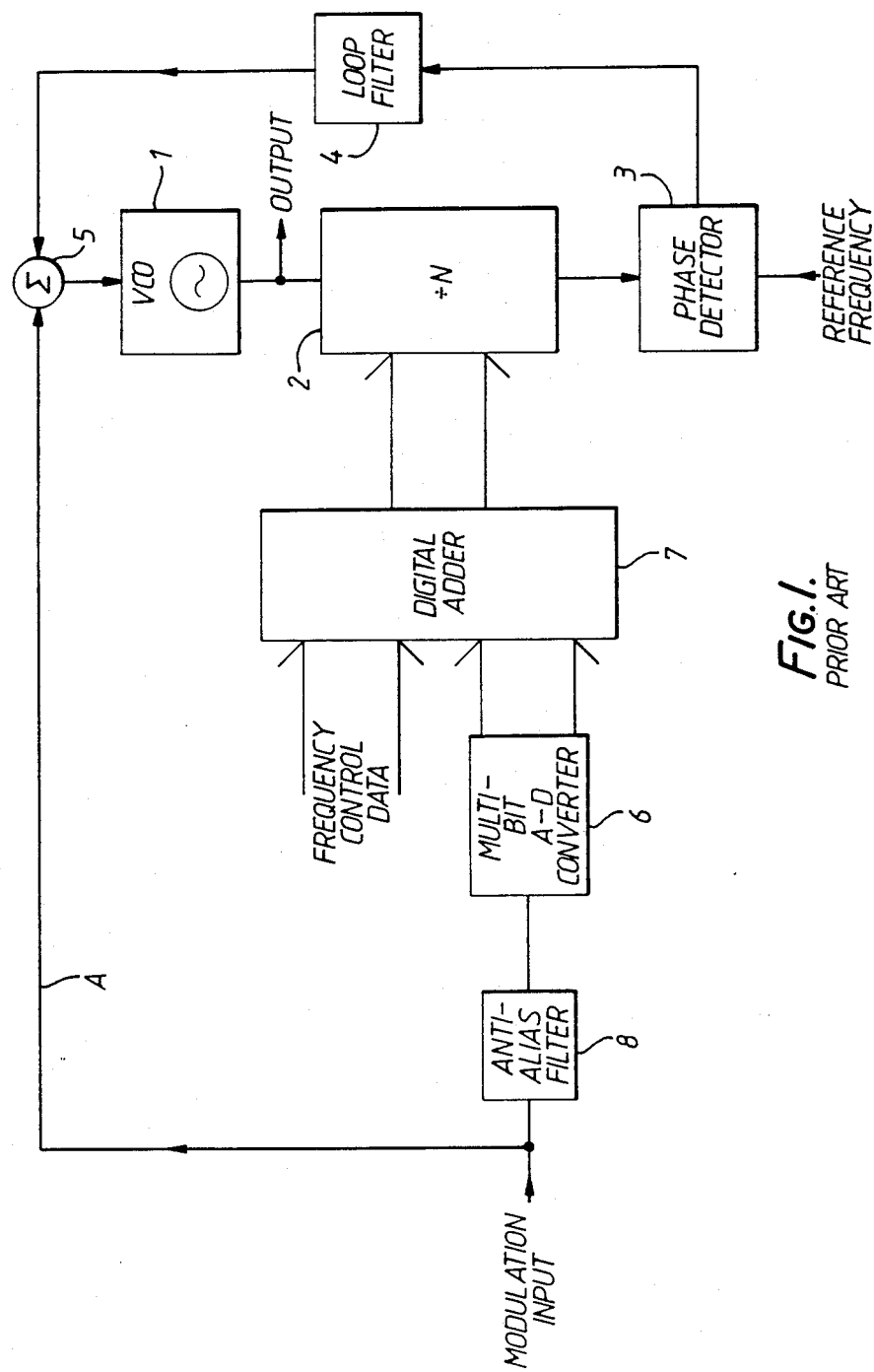
FIG. 1 is a block circuit diagram of a known synthesizer using DC-coupled frequency modulation.

With reference first to FIG. 1, a conventional DC-coupled frequency modulation synthesizer comprises a voltage-controlled oscillator (VCO) 1 which is phase-locked to a frequency reference by dividing its frequency by a controllable factor N and comparing the resulting frequency with a reference frequency in a phase detector 3. The output from the phase detector is passed through a loop filter 4 and the resulting signal is used to correct errors in the VCO frequency. Frequency modulation is obtained by applying the modulation signal at two points in the loop. Firstly, the VCO is modulated directly by adding the modulation input signal from line A to the loop filter output voltage by means of an adder 5. This provides modulation up to very high frequencies since, in principal, the VCO input bandwidth can be high.

At frequencies within the phase-locked loop bandwidth, the loop tries to remove this directly applied frequency modulation signal since it is seen as a frequency or phase error. At low frequencies, virtually all the frequency modulation signal is removed. In order to allow DC-coupled frequency modulation to be obtained, a further modulation route 6, 7, 8 manipulates the division ratio N in the variable ratio divider 2. The frequency modulation signal, after being filtered in an anti-alias filter 8, is converted into a digital word by a multi-bit analogue-to-digital converter 6. The resulting digital word is then added to frequency control data by a digital adder 7 and the resulting digital signal is used to control the division ratio N of the divider 2.

The frequency control data are derived from an input representing the centre frequency currently required, expressed as the appropriate multiple of the reference frequency.

The system is arranged so that the two modulation routes are matched in gain and phase. As a result, since the number N is being varied in sympathy with the modulation, no error is seen in the loop and the modulation characteristics are preserved down to DC.

The division ratio N need not be an integer. There are known techniques of frequency synthesis, usually referred to as "fractional N", which allow the number N to be set at a selected fractional value. All the techniques described in this specification are capable of using fractional N synthesis.

This known system, described with reference to FIG. 1, does have some significant disadvantages. The first is that the analogue-to-digital converter (ADC) 6 generally has a finite resolution. As a result, when the modulation signal varies, the digital word from the converter 6 must change in steps and hence the output frequency of the VCO 1 changes in discrete steps. In addition, the converter 6 has three sources of time or phase error. The first time error is introduced because the converter 6 has a finite conversion time. As a result, the output of the converter 6 is a delayed representation of the modulation signal. The second phase/time error is introduced by the anti-alias filter 8, which is provided to remove aliasing signals from input signals of high frequency, which aliasing signals would otherwise give rise to unwanted spurious signals. A third source of delay arises because in practice the divider division ratio does not immediately respond to a change in control instruction, but this error is usually relatively small.

The effect of this phase/time error is that the two modulation routes are not exactly matched. Error signals do therefore exist in the phase-locked loop. This is particularly noticeable at frequencies approximately equal to the loop bandwidth. The modulation deviation can exhibit significant amplitude and phase error as the phase-locked loop responds to and tries to minimise the phase error. Narrowing the loop bandwidth would help to reduce this source of error since the time errors would then represent less phase, but this could result in a degradation in the synthesizer speed and in its noise performance. Some of the effect could be reduced by using digital prediction techniques, but this would add considerable complexity and would not be entirely accurate under all stimulae. The errors would be particularly noticeable if the modulation signal were a square wave.

Both embodiments of the invention described below overcome these problems with relatively little complexity and cost. They are based on the use of an improved charge-balanced converter of the type referred to above.

Figure 2:
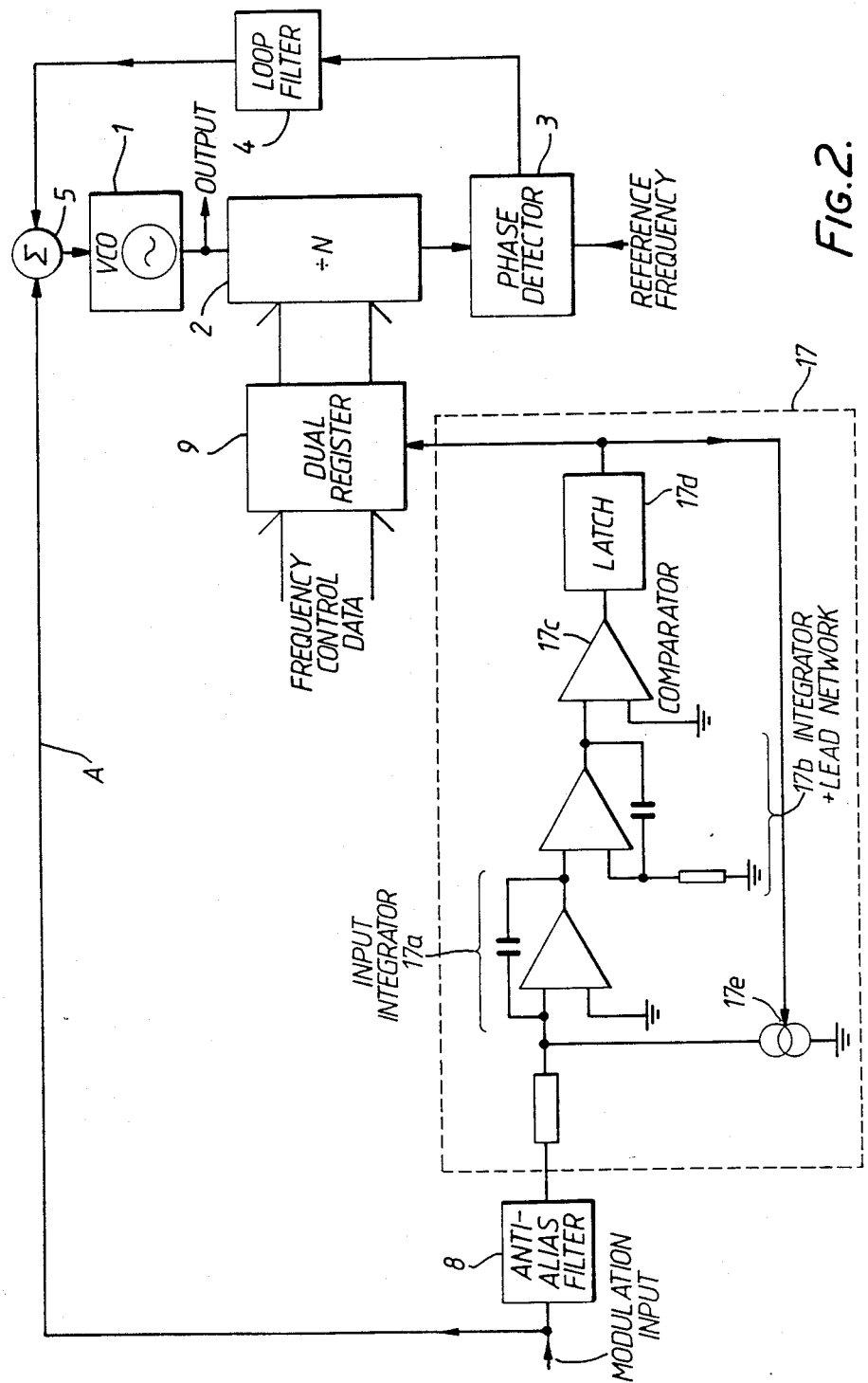
FIG. 2 is a block circuit diagram of a synthesizer similar to that of FIG. 1 but modified, in accordance with a first embodiment of the invention, to include a second order charge-balanced converter in place of the ADC of FIG. 1.

FIG. 2 shows the first embodiment of the invention. The modulation is in principle obtained as previously described by modulating the VCO 1 directly and manipulating the division ratio N of the divider 2 in sympathy with the modulating signal. The division ratio N of the divider, however, is arranged to have only two possible values, i.e. the division ratio is controlled by a one-bit analogue-to-digital converter 17. The two values are stored in a dual register 9, and constitute the frequency control data which typically change in accordance with the centre frequency and the bandwidth required to be synthesized.

The converter 17 in this case is a second order charge-balanced converter, but higher order converters can beneficially be used in many cases.

The converter 17 acts to produce a series of logical ones and noughts at its output which are fed back to control a switched current source 17e in such a way as to balance the average current at the input to an integrator 17a. The output of the integrator 17a is integrated by a further integrator and lead network 17b whose output is compared with a reference DC level, such as earth, by a comparator 17c. A latch 17d has two states, corresponding to the output of the comparator 17c, and provides an output signal which represents the level of the analogue input signal. The charge-balanced converter 17 acts to chase out low frequency noise content at the output of the latch 17d. The phase-locked loop in many ways acts as a low pass filter which averages out the high frequency content of the signal on the latch output. It can be classed as a rather special type of digital/analogue filter (since its output is an analogue signal it cannot be classed as a digital filter). Its frequency response is thus noise-shaped: noise is substantially reduced below a threshold frequency, at the expense of an increase above that frequency. The transfer function of the VCO 1 phase detector 3 and loop filter 4 is that of a filter centred on the VCO frequency, with a half-bandwidth equal to the bandwidth of the loop filter 4. The noise content of the data stream of noughts and ones is negligible, i.e. substantially below the white noise level which would prevail without noise-shaping, below the threshold. In this case, the threshold is near the upper limit of the phase-locked loop bandwidth. The noise at higher modulation rates, which is increased above the white noise level, is of no consequence because it is filtered out by the transfer function of the phase-locked loop.

The control of the divider 2 does not in this case require the use of a digital adder, though it could be implemented using such an adder since the two division ratios could be stored in the registers 9 and the latch 17d output could then be used simply to switch between the two registers.

In contrast to that obtained with conventional techniques, the resolution is not limited by the actual resolution of the frequency registers and dividers. Moreover the scheme can be applied to any synthesizer which has means for providing coherent frequency selection between two frequencies.

The system described with reference to FIG. 2 has other advantages over conventional systems. The converter 17 has effectively no limits to its resolution: its performance is limited by the amount of noise it injects into the phase-locked loop. Provided the ratio between the latch clock frequency and the phase-locked loop bandwidth is maintained at a high level (typically of the order of 1000:1) it is found that the performance is more than adequate.

The converter 17 itself is also effectively very fast. Theory shows that the conversion time is effectively approximately half the period of the clock frequency to the latch 17d. Since this frequency can be very high, the effective delay is very low and this reduces the design problems caused by the mismatch of signals in the two modulation paths.

The converter 17 is also very simple to implement compared with the usual approach of using multi-bit high speed converters.

Figure 3:
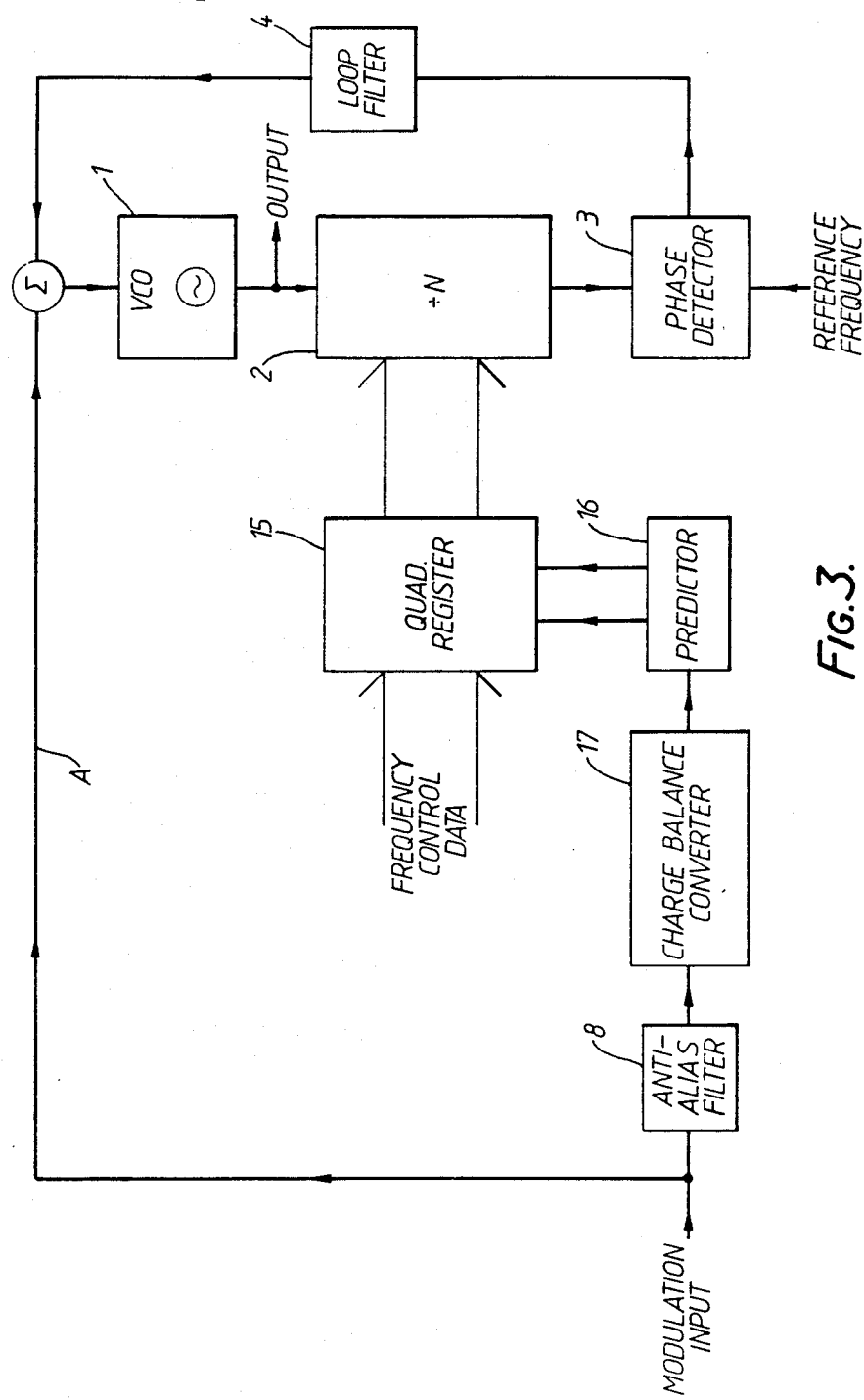
FIG. 3 is a block circuit diagram similar to that of FIG. 2, in accordance with a second embodiment of the invention.

The design approach also lends itself to the addition of digital predictor circuits. The remaining time/phase mismatch between the two modulation paths can be compensated for by using a digital circuit which predicts future events based on past information. Such algorithms are known and work particularly well in bandwidth-limited systems of this type. In this case they are particularly easy to implement, because the digital data stream is only one bit wide. When predictor circuits are used, the digital output of the predictor is always wider than the input data. A first order predictor results in a data width of two bits. The increased data width can be accommodated simply by using four input registers instead of two and allowing the two-bit data to control which register is selected, as shown in FIG. 3 which is a diagram of the second embodiment of the invention.

If even higher performance is required, there is some advantage in increasing the clock rate to frequencies above that of the phase detector 3. The converter output is then digitally filtered before being used to control the divider setting. Again this results in the data width being increased. The principal advantage that is gained is that the design of the anti-alias filter 8 is easier since aliasing effects are only produced at higher modulation frequencies. The technique described above can also be used, with some adaptation, to implement a phase modulation system. As phase modulation can be represented mathematically as the integral of frequency modulation, then, if the data stream of ones and noughts is differentiated, the input modulate on represents phase instead of frequency. The direct modulation path A would also have to be modified.

It is also sometimes desirable to have an AC-coupled frequency modulation input to the VCO 1. This can be implemented by digitally filtering the ADC 17 output to form a high-pass network. In a typical application, the high pass network break frequency could be 1 Hz. Implementing the filter digitally can enable the break frequency to be software-controllable.

If the required modulation bandwidth is relatively low and the phase-locked loop bandwidth is adequately high, the systems described above can be used without the direct modulation path A, i.e. without modulating the VCO 1 directly.

Although the invention has been illustrated as using a 1-bit charge-balanced ADC, an alternative would be any ADC with appropriate noise-shaping to reduce substantially the noise within the bandwidth of the phase locked loop.

What I claim is:

1. A frequency or phase modulator comprising a voltage-controlled oscillator in series with a divider in a phase-locked loop, and an analogue-to-digital converter connected to control the divider in accordance with an analogue modulation signal, the analogue-to-digital converter having a noise-shaped frequency response so as to reduce noise at frequencies below the loop bandwidth to substantially below the white noise level which would prevail without noise-shaping.

2. A modulator as claimed in claim 1, comprising means for applying the input modulation signal to the voltage-controlled oscillator.

3. A modulator as claimed in claim 2, in which the components of the modulator have characteristics selected such that at the phase-locked loop bandwidth the gain of the modulation route via the analogue-to-digital converter is substantially equal to the gain of the modulation applied to the voltage controlled oscillator.

4. A modulator as claimed in claim 1, in which the analogue-to-digital converter is a one-bit converter.

5. A modulator according to claim 1, in which the output of the analogue-to-digital converter is connected to a control input of the divider by way of digital control means.

6. A modulator as claimed in claim 5, in which the control means for the divider comprises at least two registers and means responsive to a signal from the analogue-to-digital converter to select, in accordance with that signal, the contents of one of the registers and to control the divider in accordance with those contents.

7. A modulator as claimed in claim 5, in which the divider is a fractional N divider.

8. A modulator as claimed in claim 6, in which the divider is a fractional N divider.

* * * * *